United States Patent [19]

Scheckel et al.

[11] Patent Number: 4,516,113

[45] Date of Patent: May 7, 1985

[54] DIGITAL TONE GENERATOR FOR TONE SEQUENCES

[75] Inventors: Bruno Scheckel; Ernst Wittenzellner, both of Munich, Fed. Rep. of Germany

[73] Assignee: Siemens Aktiengesellschaft, Berlin and Munich, Fed. Rep. of Germany

[21] Appl. No.: 313,253

[22] Filed: Oct. 21, 1981

[30] Foreign Application Priority Data

Nov. 18, 1980 [DE] Fed. Rep. of Germany ....... 3043505
Jun. 15, 1981 [DE] Fed. Rep. of Germany ....... 3050148

[51] Int. Cl.³ ........................ H03K 5/156; G08B 3/00
[52] U.S. Cl. ................................................ 340/384 E
[58] Field of Search .................................... 340/384 E

[56] References Cited

U.S. PATENT DOCUMENTS 4,073,133 2/1978 Earls et al. ...................... 340/384 E
4,396,909 8/1983 Suzuki ............................ 340/384 E

OTHER PUBLICATIONS

Publication "Funkschau" (1980), No. 20, pp. 87–90.

*Primary Examiner*—Glen R. Swann, III
*Attorney, Agent, or Firm*—Herbert L. Lerner; Laurence A. Greenberg

[57] ABSTRACT

Semiconductor circuits for the automatic generation of tone sequences of different tones. A bistable switch having a control input activated by start signal controls a voltage stabilizing circuit which in turn controls an RC-oscillator. Several frequency dividers are driven by the oscillator for producing divider outputs as tone signal outputs furnishing individual tone frequencies corresponding to the tone sequences to be produced. A general cycle control has inputs controlled by the first divider output. Modulator modules driven by the cycle control and by the tone signal outputs, are connected to the digital-to-analog converters which produce tone signal outputs that correspond to the individual tone frequencies. The digital-to-analog converters have outputs that are jointly connected to an electro-acoustic transducer, such as a loudspeaker.

17 Claims, 5 Drawing Figures

DIGITAL TONE GENERATOR FOR TONE SEQUENCES

BACKGROUND AND PRIOR ART

The invention relates to a tone generator with a semiconductor circuit for the automatic generation of a tone sequence including at least two different tones, by means of an electro-acoustic transducer or loudspeaker driven by the semiconductor circuit, the semiconductor circuit containing an RC-oscillator and at least one frequency divider driven by the oscillator.

Semiconductor circuits for the driving of electro-acoustic transducers, i.e. loudspeakers, have been available for some time. In such circuits electrical oscillations corresponding to the tones to be produced are generated in the semiconductor circuit on a purely electrical basis, especially on a digital basis. These oscillators are then supplied to the loudspeaker in order to generate the tones corresponding to the frequency of the respective electrical oscillations with its help. One example of this is electric organs which, however, are manually operated and contain rather sophisticated circuitry. It is desired to monolithically integrate the circuit components performing the various functions to the greatest possible extent, because external circuit components weigh heavily costwise.

A tone generator of this type is described in the German patent application DE-AS No. 26 01 1922.

Besides electronic musical instruments, there is also a simpler apparatus for tone generation on the basis of monolithically integrated semiconductor circuits. One example of this is electronic signal generators which, upon the actuation of a push button, generate a given melodic tone sequence, such as a common chord, without further interference. Examples are described in "Funkschau" (1980) No. 20, pages 87–90. Since, in contrast to the electronic musical instruments, the tone sequence is fixed in these cases, such a circuit can be constructed in a much simpler manner. However, electrical gongs, such as for use as a bell substitute, usually involve merely using the square-wave oscillations furnished by an RC-oscillator and corresponding frequencywise, for instance, to the highest tone of the sequence for the derivation of the electrical oscillations corresponding to the other tones of the tone sequence to be produced. Therefore, only one electrical oscillation is available for each of the individual tones of the tone sequence, which are then supplied to the loudspeaker in accordance with the tone sequence.

SUMMARY OF THE INVENTION

It is accordingly on object of the invention to provide a tone generator which overcomes the hereinafore-mentioned disadvantages of the heretofore-known devices of this general type, and to do so in such a way that the tone sequence is generated automatically upon energizing the tone generator, such as by closing an activating switch. It is endeavored in this context to provide a tone quality improvement and above all a reduction of the monolithically non-integrable part of the circuit in comparison with the possibilities available to date.

With the foregoing and other objects in view there is provided, in accordance with the invention, a tone generator having a semi-conductor circuit for the automatic generation of a tone sequence of at least two different tones from an electro-acoustic transducer driven by the semiconductor circuit, comprising a bistable switch having a control input being activated by a start signal, a voltage stabilizing circuit being activated by the bistable switch for furnishing a voltage, circuit components and an RC-oscillator for producing a base frequency all being activated by the voltage furnished by the voltage stabilizing circuit, at least one frequency divider being driven by the oscillator at the base frequency for producing a first divider output and tone signal outputs furnishing individual tone frequencies corresponding to the tone sequence to be produced, a general cycle control having inputs and being controllable by the first divider output, a modulator being drivable by the cycle control and by the tone signal outputs, digital-to-analog converters each being connected to one of the tone signal outputs and being coordinated with the individual tone frequencies, the digital-to-analog converter having outputs being jointly connectible ("connected") to the electro-acoustic transducer.

In accordance with another feature of the invention, there is provided a low-frequency amplifier connected between the digital-to-analog converter outputs and the electro-acoustic transducer.

In accordance with a further feature of the invention, the cycle control includes means for interrogating the state present at the inputs thereof after the lapse of a given dead time and after a response of the bistable switch, and for releasing the generation of the tone sequence exclusively in the presence of the start signal at the control input of the bistable switch.

In accordance with an added feature of the invention, there are provided means being associated with the running of the tone sequence for again interrogating for the presence of the start signal at the control input of the bistable switch at the end of the tone sequence.

In accordance with an additional feature of the invention, the RC-oscillator includes means for generating a reset pulse for resetting the cycle control to a starting state required for generation of the tone sequence, after activation by the voltage stabilizing circuit.

In accordance with again another feature of the invention, the bistable switch is a flip-flop being controlled by the control input acted upon by the start signal and having a signal output for driving the voltage stabilizing circuit.

In accordance with again a further feature of the invention, the bistable switch and stabilizing circuit include a first npn-transistor having a base connected to the control input activatable by the start signal, an emitter connected to reference potential, and a collector, a circuit input carrying a first operating potential, a voltage divider connected between the first operating potential input and the collector of the first npn-transistor, a first pnp-transistor having a base connected to the divider point of the voltage divider, an emitter connected to the first operating potential input, and a collector, a first resistor connected between the collector of the pnp-transistor and reference potential, a second resistor connected to the collector of the pnp-transistor, a second npn-transistor having a base connected to the collector of the pnp-transistor through the second transistor, an emitter furnishing the voltage furnished by the voltage stabilizing circuit, and a collector, a third npn-transistor having a base connected directly to the emitter of the second npn-transistor and a collector, a third resistor connected between the emitter and the base of the second npn-transistor, the collectors of the second and third npn-transistors being connected directly to the first operating potential input and to the emitter of the pnp-transistor, a diode combination effecting voltage stabilization being connected between the base of the second npn-transistor and reference potential, and a resistor and diode combination being connected between reference potential and the base of the first npn-transistor connected to the control input.

In accordance with again an added feature of the invention, there is provided a fourth npn-transistor having an emitter and a collector directly connected to the emitter and the collector of the first npn-transistor, respectively, and a base, a fourth resistor connected between the base of the fourth npn-transistor and the collector of the pnp-transistor of the bistable switch, a fifth resistor connected between reference potential and the base of the fourth npn-transistor, and an RS-flip-flop being controlled by the frequency divider and having a non-inverting output connected to the base of the fourth npn-transistor.

In accordance with again an additional feature of the invention, the amplifier includes an output and an npn-transistor having a collector-emitter path connected between the emitter of the third npn-transistor and the output of the amplifier.

In accordance with yet another feature of the invention, the RC-oscillator includes a signal output for controlling the frequency divider furnishing oscillations required for the tone sequence, and including another divider stage forming the cycle control and being clocked by one of the outputs of the frequency divider furnishing the highest frequency, the tone signal outputs of the frequency divider and the divider stage together controlling the modulator.

In accordance with yet a further feature of the invention, the amplifier includes an input, the cycle control includes outputs, and the modulator includes a plurality of identical logic gates operating independently of each other and being controlled individually by the outputs of the frequency divider and the outputs of the cycle control, the gates having outputs connected to the input of the amplifier for the joint logic control of the amplifier.

In accordance with yet an added feature of the invention, the logic gates are AND gates each having three signal inputs, one of the inputs of each AND gate being connected to an output of the frequency divider and the other two of the inputs of each AND gate each being connected to one output of the cycle control.

In accordance with yet an additional feature of the invention, there is provided a plurality of resistors each being connected between the input of the amplifier and the output of one of the logic gates of the modulator for an analog application to the input of the amplifier, the resistors having values being balanced in accordance with the logic gates wired thereto for delivering an analog signal to the amplifier corresponding to the number of logic gates of a tone signal output of the frequency divider and simultaneously activated by the cycle control.

In accordance with still a further feature of the invention, there is provided a circuit input carrying a first operating potential, a reference potential input, a terminal receiving a stabilized operating potential through the voltage stabilizing circuit, a control input of the oscillator for frequency control of the oscillator, a manually operable switch connected between the control input and the first operating potential input, a capacitor, an output of the amplifier, the electro-acoustic transducer being connected through the capacitor to the output of the amplifier and being directly connected to the reference potential input, and a resistor and another capacitor together determining the frequency of the oscillator, the stabilized operating potential terminal being connected through the resistor and other capacitor to the reference potential input and through the resistor to the control input of the oscillator.

In accordance with another feature of the invention, there is provided an input of the amplifier, and a further capacitor connected between the input of the amplifier and the reference potential input.

In accordance with a concomitant feature of the invention, there is provided an input of the amplifier which is also an additional control input.

Other features which are considered as characteristic for the invention are set forth in the appended claims.

Although the invention is illustrated and described herein as embodied in a tone generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

DESCRIPTION OF THE PREFERRED EMBODIMENTS

Figure 2:
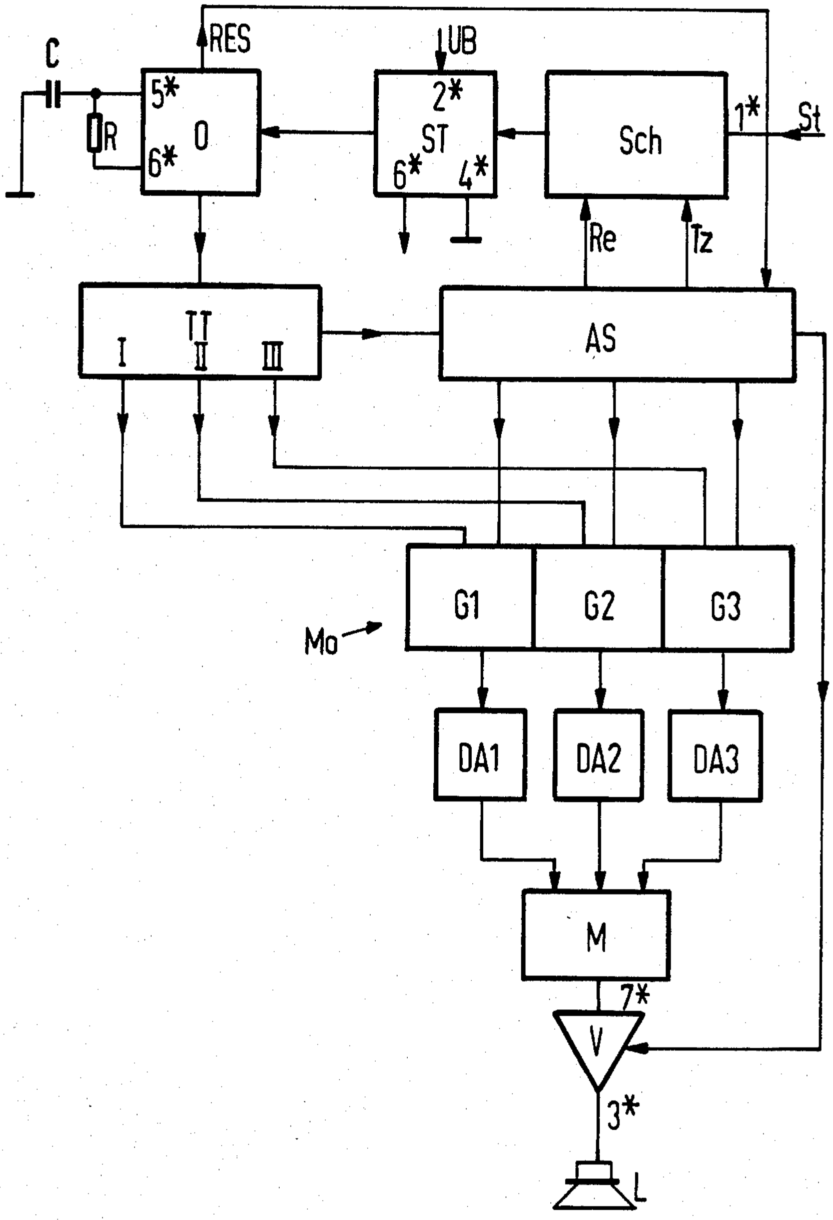
FIG. 2 is a schematic and block circuit diagram of the individual internal components of the tone generator itself.

Referring now to the figures of the drawing and first particularly to FIG. 2 thereof, it is seen that for the semiconductor circuit of a tone generator according to the invention, there is first of all provided an RC-oscillator 0 driven by a frequency-determining timing element through two control inputs 5* and 6*. The frequency-determining timing element includes the resistor R bridging the two terminals 5* and 6* and the capacitor C connecting the terminal 5* of the oscillator 0 to reference potential (ground).

On the other hand, the rectangular pulses furnished by the oscillator 0 reach a frequency divider TT which is formed in a known manner of a number of identical flip-flop cells being connected in series regarding their signal-carrying outputs and inputs, thus corresponding to a binary synchronous or asynchronous counter. An output I, an output II, and an output III which are each of a selected flip-flop of the divider chain TT, each furnish one tone frequency of the tone sequence to be generated, i.e. a rectangular oscillation, derived by frequency division from the mother frequency furnished by the oscillator 0 and of the frequency corresponding to the respective tone. The frequency levels correspond to the logic states "0" and "1". These oscillations are each supplied to one circuit component G1, G2, G3, respectively, of a modulator Mo. Moreover, these circuit components G1, G2, G3 are each controlled through a second input by the tone frequency divider TT by way of a cycle control AS with practically the same frequency as each of the inputs of the respective circuit component of the modulator Mo.

Each one of these circuit components G1, G2, G3 of the modulator Mo controls one digital-to analog converter DA1, DA2, DA3, respectively, which have outputs that serve to control an electroacustic transducer of loudspeaker L through a common mixer stage M and an amplifier V succeeding the mixer stage M at a terminal 7* for controlling the tone frequency generator To. The amplifier, which has an output 3*, may also be additionally influenced directly with respect to its gain by the cycle control. As FIG. 2 shows the tone generator as a block diagram.

It is the job of a stabilizing circuit block ST to stabilize the operating voltage to be supplied to the various circuit components and to then forward it to the other circuit components. The stabilizing circuit ST receives its supply voltage UB through the terminal 2* and ground at terminal 4* FIG. 2 is a block diagram that may be monolithically provided without a problem. Another terminal 6*, together with the terminal 4*, furnishes the stabilized d-c voltage to be forwarded to the various circuit components.

The key position of the stabilizing circuit ST explains why the start signal to be applied to the input 1* of the tone generator first affects the stabilizing circuit ST, as may be seen from FIG. 2. The means provided for this function is a switch Sch, in the form of a flip-flop having a reset input, and being controlled in turn by the cycle control AS in two respects. The switch Sch is set, for instance, by actuating the push button Dt shown in FIG. 1 or by a continued start signal St to be kept alive during the actuation time of the circuit. However, it may also be the case that the flip-flop Sch is tipped into its operating state, such as due to an interference signal stemming from another circuit component. To preclude this possibility, the logic state is interrogated again at the inputs of the switch Sch by the cycle control AS after a so-called dead time Tz has elapsed. The dead time Tz is, for example, 10 msec. If then the inputs of switch Sch still carry the start signal St, the circuit, i.e. the tone signal to be applied to the second inputs of the circuit components G1, G2, G3 of the modulator Mo, is cleared. Otherwise, the cycle control AS will give a reset signal Re to the input switch Sch so as to tip it back into its initial state.

Along with the end of the start signal St, the operating state of the stabilizing circuit ST, of the oscillator 0 and of the tone frequency divider TT is also changed, these components then being shut off automatically. After the beginning of a start signal St and the activation of the oscillator 0 thus initiated, the oscillator 0 first generates a general reset signal RES which assures through the cycle control AS that all circuit components are in, or go into, the initial state required for the generation of the tone sequence. Details regarding the operating cycle of the preferred circuit are given in the description of a circuit embodiment according to FIGS. 3 and 4 to be used accordingly.

Figure 3:
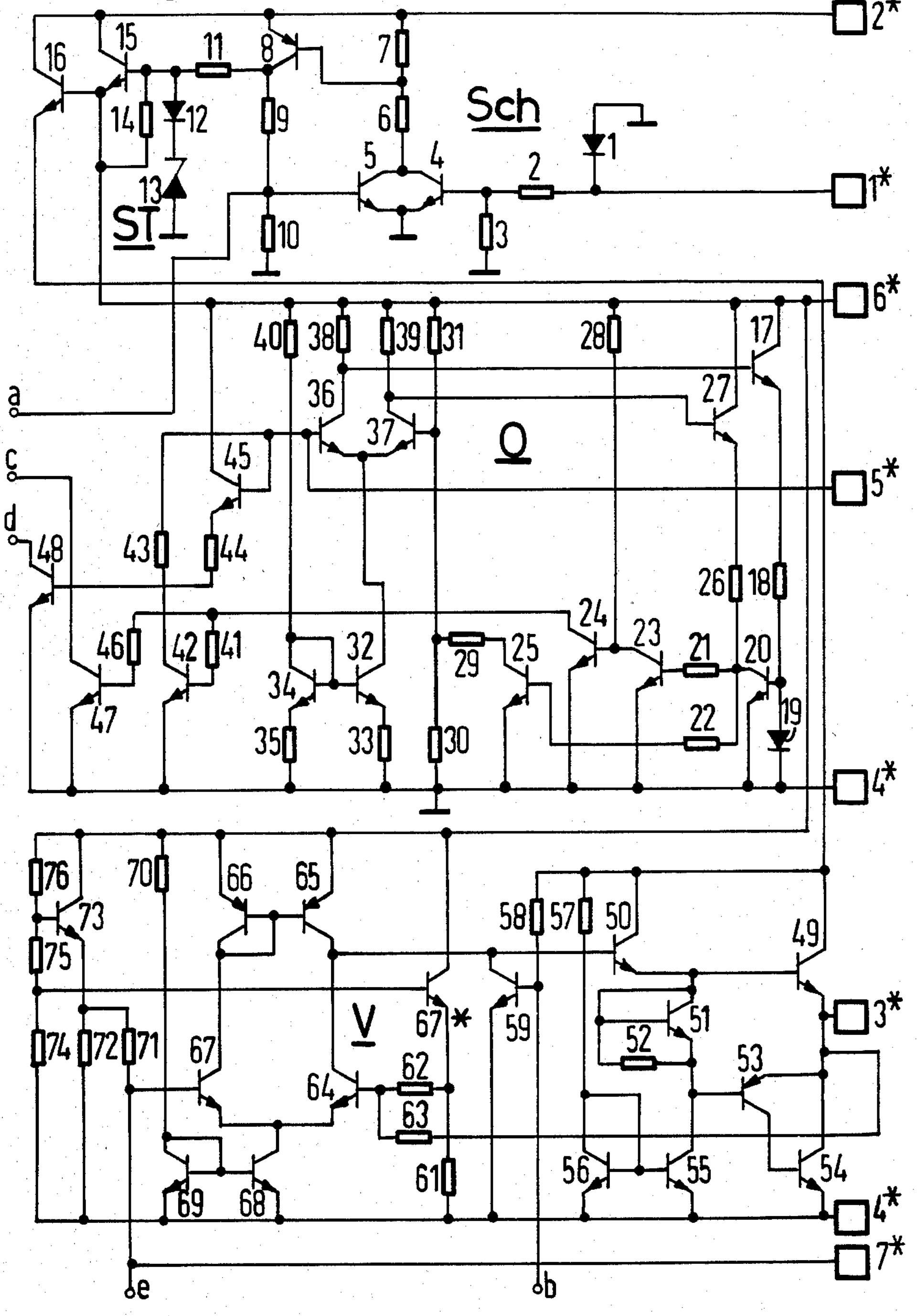
FIGS. 3 and 4 are schematic circuit diagrams of the detailed circuitry of the components of FIG. 2.
Figure 4:
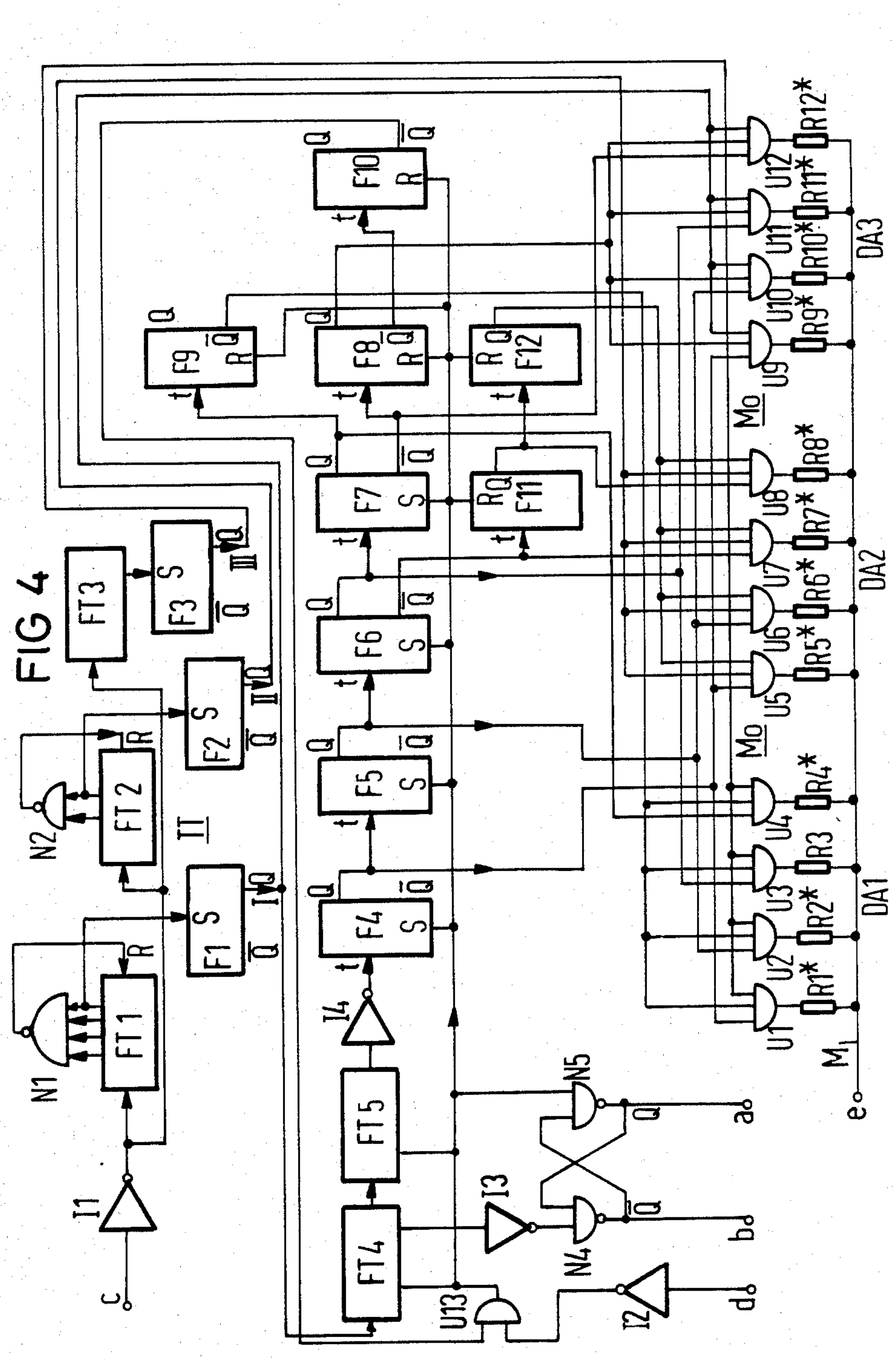

The circuit shown in FIG. 3 relates to a bipolar embodiment of a tone generator according to the invention as shown in FIG. 2, which is to be provided monolithically and contains the stabilizing circuit ST, the oscillator 0 and the low-frequency amplified V of the circuit shown in FIG. 2. FIG. 4 shows an embodiment of the circuit components required for the tone frequency divider TT, the cycle control AS, the amplifier V and the modulator circuit Mo etc., i.e. those given by logic gates or flip-flops.

Figure 1:
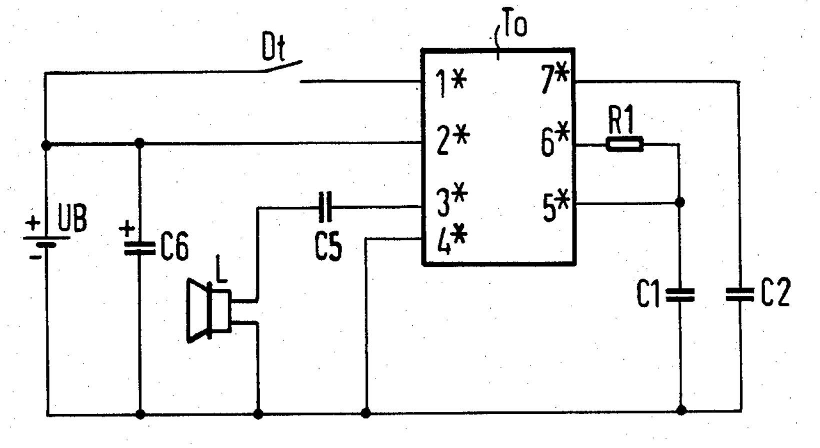
FIG. 1 is a schematic and block circuit diagram of the external circuitry of the tone generator according to the invention.

As is evident from FIG. 1, the start signal furnished by a push button Dt, is applied to the input 1* of the tone frequency generator circuit. With respect to FIG. 3, the start signal first affects the switching stage SCH preceding the stabilizing stage ST. The switching stage SCH essentially includes two first npn-transistors 4 and 5 and a pnp-transistor 8 which jointly form a flip-flop. For this purpose the circuit input 1*, to be energized by the push button Dt, is connected to the cathode of a diode 1, the anode of which carries the reference potential (ground) which is connected to the terminal 4* of the circuit. In addition, the input 1* is connected through a resistor 2 to the base of the first npn-transistor 4, which is also connected to reference potential through a resistor 3. The emitter of the first npn-transistor 4 and the emitter of the npn-transistor 5 likewise carry the reference potential, whereas their collectors are connected to the terminal 2* of the circuit through a voltage divider 6, 7. The divider point between the two resistors 6 and 7 forming the voltage divider is connected directly to the base of the first pnp-transistor 8. The collector of the first pnp-transistor 8 is connected through a resistor 9 to the base of the second 15 npn-transistor of the switch SCH, i.e. the base of the transistor 5. The base of the transistor 5 is also connected through a resistor 10 to reference potential ground, i.e. to the terminal 4* of the circuit, and finally is also controlled, in a manner yet to be described, by the flip-flop N4, N5 shown in FIG. 4, through a circuit point a. In FIG 3 the emitter of the pnp-transistor 8 is connected to the positive pole of the supply voltage source UB, i.e. to the terminal 2* of the circuit.

The stabilizing circuit ST is activated by the switch SCH through the emitter-collector path of the pnp-transistor 8. The voltage stabilizing circuit ST contains the essential components which are two npn-transistors 15 and 16, combined into a Darlington stage, and a Zener diode 13 to provide the desired level of the d-c voltage to be supplied to the rest of the circuit.

For this purpose, the collectors of the two npn-transistors 15 and 16 are connected to the emitter of the pnp-transistor 8 of the switching stage SCH, and hence to the terminal 2*. Furthermore, the base of the npn-transistor 15 is connected through a resistor 11 to the collector of the pnp-transistor 8 as well as to the anode of a diode 12 and through a resistor 14 to its own emitter. The cathode of the diode 12 is connected to the cathode of the Zener diode 13, and is connected through the Zener diode 13 to the terminal 4*, and hence to the reference potential. Finally, the emitter of the npn-transistor 15 is connected to the base of the other npn-transistor 16 of the stabilizing circuit. The npn-transistor 16, which is wired as an emitter follower, serves in a manner yet to be described as a current supply for other circuit components. In addition, the emitter of the npn-transistor 15, and therefore the base of the npn-transistor 16 of the stabilizing circuit ST, is connected to the terminal 6* of the circuit, and therefore, as is evident from FIGS. 1 and 2, to the resistor R1 of the timing element determining the oscillator frequency.

The oscillator, an RC-oscillator 0, is driven through the inputs 4*, 5* and 6*, as shown in FIG. 3. The oscillator 0 contains fourteen npn-transistors and a diode as well as resistors. In detail, the terminal 4*, carrying the reference potential, is first connected to the cathode of a diode 19 and directly to the emitter of an npn-transistor 20, while the anode of the diode 19 is connected to the base of the npn-transistor 20, and through a resistor 18 to the emitter of another npn-transistor 17. The collector of the transistor 17 is connected directly to the terminal 6* of the circuit, and the base of the transistor 17 is connected thereto through a resistor 38.

The npn-transistor 20, already mentioned above as having the base thereof connected to the reference potential through the diode 19, has the collector thereof connected through a resistor 21 to the base of an npn-transistor 23, having an emitter that likewise carries the reference potential at the terminal 4*, while the collector of the transistor 23 is connected through a resistor 28 to the terminal 6*. The collector of the transistor 23 is therefore connected to the emitter of the npn-transistor 15 in the stabilizing cicuit ST on one hand, while there is a direct connection between the collector of npn-transistor 23 and the base of npn-transistor 24 on the other hand.

The emitter of the npn-transistor 24 is again connected to the reference potential, i.e. to the terminal 4*, while the collector thereof is connected to each of the bases of npn-transistors 42 and 47, respectively, through resistors 41 and 46, respectively. The emitters of the two last-mentioned npn-transistors, 42 and 47, also carry reference potential so that these transistors as well, are operated in a common emitter circuit. The collector of the npn-transistor 42 is connected through a resistor 43 to the bases of two other npn-transistors 45 and 36, while the collector of the npn-transistor 47 is provided, in a manner yet to be described, for signalling the frequencing divider TT of the tone generator circuit through a circuit point c.

The collector of the npn-transistor 45, which has the base thereof connected to the collector of the npn-transistor 42 of the oscillator O by way of resistor 43, is connected directly to the stabilized voltage, and hence to the terminal 6* of the circuit. The npn-transistor 36, also introduced above in connection with the transistor 42, has its collector connected to the base of the previously-mentioned npn-transistor 17 on one hand, and through a resistor 38 to the terminal 6* carrying the stabilized voltage, on the other hand. Finally, the emitter of the transistor 36 is wired to the emitter of npn-transistor 37, forming a differential amplifier stage 36, 37. The collector of the transistor 37 is again connected, through a resistor 39, to the terminal 6* of the circuit which carries the stabilized voltage on one hand, and directly to the base of npn-transistor 27 of the oscillator O on the other hand. The collector of the npn-transistor 27 is connected directly to the circuit terminal 6* carrying the stabilized voltage, while the emitter of this transistor 27 is connected, through a resistor 26, to the collector of npn-transistor 20 of the oscillator, through the previously-mentioned resistor 21 to the base of the npn-transistor 23, and through another resistor 22 to the base of a twelfth npn-transistor 25, having an emitter that also carries the reference potential 4*.

The collector of the twelfth npn-transistor 25 is connected through a resistor 29 to a circuit junction point. The junction point is connected, through a resistor 30, to the reference potential, and through a resistor 31, to the circuit terminal 6* carrying the stabilized voltage. The junction point is also connected directly to the base of the npn-transistor 37, i.e. to the base of the other transistor 36 of the differential amplifier 36, 37.

The npn-transistor 45, already introduced above in connection with the npn-transistor 42, has its collector wired to the terminal 6*, as already mentioned. It should furthermore be noted with reference to this transistor 45, that its emitter is connected through a resistor 44 to the base of npn-transistor 48, the emitter of which is also connected directly to the reference potential, i.e. to the terminal 4* of the circuit, while its collector is connected, through a circuit point d, to the AND gate U13 shown in FIG. 4, and to other circuit components in a manner yet to be described.

A constant current source is provided for the current supply to the differential amplifier formed by npn-transistors 36 and 37. The current source includes npn-transistor 34, the emitter of which is connected to the reference potential through a resistor 35, and the collector and base of which are connected through a resistor 40 to the circuit terminal 6* carrying the stabilized voltage, in combination with npn-transistor 32. The emitter of this npn-transistor 32 is again wired to the reference potential by way of a resistor 33, while its base is connected to the base and to the collector of the transistor 34, and its collector, forming the output of the current source, is wired to the emitters of the npn-transistors, i.e. the transistors 36 and 37 forming the differential amplifier.

It must also be mentioned that the base of the npn-transistor 36, and accordingly the control input of the differential amplifier, is connected directly to the circuit terminal 5* . Therefore the base of the transistor 36 is connected through the capacitor C1, when applying the circuit shown in FIG. 1, to the referenced potential, i.e. to the negative pole of the d-c voltage source UB.

The differential amplifier V occupies the lower part of the circuit diagram shown in FIG. 3. The amplifier V receives its operating voltage from the emitter of the npn-transistor 15 of the stabilizing circuit ST on one hand, and from the supply terminal 4* of the overall circuit on the other hand. The wiring of the amplifier V will now be described briefly.

The stabilized input 6* of the circuit is wired to the emitters of a pnp-transistor 65 and a pnp-transistor 66 of the amplifier V. The terminals of the transistors 65, 66 are directly connected together and in addition the collector-base path of the pnp-transistor 66 is short-circuited. The collectors of the two pnp-transistors 65 and 66 are each connected to the collector of npn-transistor 64 and npn-transistor 67, respectively, the emitters of which are interconnected forming a differential amplifier, and are wired to the collector of npn-transistor 68. The npn-transistor 68 is coupled to npn-transistor 69, forming a current mirror or reflector, the transistor 69 being wired as a diode by short-circuiting its base-collector path. Furthermore, the emitters of both transistors 68 and 69 are connected to the reference potential, i.e. to the terminal 4*. Finally, the base terminals of the transistors 68 and 69 are connected, through a resistor 70, to the circuit terminal 6* carrying the stabilized voltage.

The base of the npn-transistor 67 in the differential amplifier 64, 67 is connected directly to the terminal 7* of the overall circuit which, as already mentioned in the discussion of FIG. 2, can serve for controlling other circuit components, such as another tone frequency generating circuit. Furthermore, the base of the npn-transistor 67 is driven through a circuit point e by the mixer M, i.e. by the signal serving for the control of the loudspeaker L, thus acting as an amplifier input. Finally, the base of the transistor 67 is wired through a resistor 71 to the emitter of npn-transistor 73. The emitter of the transistor 73 is connected to the reference potential through the resistor 72, its collector is connected to the circuit terminal 6* carrying the stabilized voltage, and its base is connected to the reference potential 4* through a voltage divider 75, 74. In addition, a resistor 76 is connected between the collector and the base of npn-transistor 73. The dividing point of the voltage divider 74, 75 is wired to the base of npn-transistor 67*, the collector of which is likewise connected to the circuit terminal 6* carrying the stabilized voltage, while its emitter is wired through a resistor 62 to the base of the npn-transistor 64 forming the reference input of the differential amplifier 64, 67, and in addition to the reference potential through a resistor 61.

The emitter of npn-transistor 59 is connected to the reference potential 4* and its collector is connected to the collector of the pnp-transistors 65 and to the collector of the npn-transistor 64. Finally, the base of the npn-transistor 64, and accordingly the reference input of the differential amplifier 67, 64, is connected through a resistor 63 to the output 3* of the low-frequency amplifier and therefore to the electro-acouetic transducer L.

Moreover, the collectors of the pnp-transistors 65 and of the two npn-transistors 64 and 59 are connected to the base of an seventh npn-transistor 50. The base of the seventh npn-transistor 59 is controlled by the flip-flop N4, N5 shown in FIG. 4 through a circuit point b, in a manner yet to be described. On the other hand, the base of the transistor 59 is wired through a resistor 58 to the emitter of the transistor 16 which forms an output of the stabilizing circuit ST, and has already been described. The collector of npn-transistor 50 is also wired directly to the emitter of this transistor 16. The same applies to the collector of npn-transistor 49, the base of which is connected to the emitter of the npn-transistor 50 and the emitter of which is connected to the terminal forming the output 3* of the amplifier V. Furthermore, the emitter of the npn-transistor 50 and the base of the npn-transistor 49 are connected to the collector of npn-transistor 51, having a base that is shorted to its own collector and an emitter which is connected to its own base through a resistor 52.

The emitter of an npn-transistor 56, with a shorted collector-base path, is connected to the reference potential 4* and also to the base of npn-transistor 55, the emitter of which is likewise connected to the reference potential 4*. The collector of the npn-transistor 56 is wired through a resistor 57 to the emitter of the transistor 16 of the stabilizing circuit ST, while the collector of the npn-transistor 55 is connected directly to the emitter of the npn-transistor 51 on one hand and to the base of a pnp-transistor 53 on the other hand. The collector of the pnp-transistor 53 is wired to the base of npn-transistor 54, the emitter of which is connected to the reference potential 4* and the emitter of which, together with the collector of the pnp-transistor 53, is connected to the terminal 3* of the circuit, i.e. to the signal output of the amplifier V.

As may be seen in FIG. 4, the circuit point c, already mentioned in connection with the npn-transistor 47 of the oscillator O, is wired to the signal input of three frequency dividers FT1, FT2, FT3 through an inverter I1. The oscillator O is tuned so as to furnish a frequency of 13.2 kHz, for instance. This frequency is used to derive the frequencies 440 Hz, 550 Hz and 660 Hz in the frequency dividers, which are then respectively applied to the outputs I, II, III of the frequency divider circuit TT. For this purpose, the divider output of each of the respective dividers FT1, FT2, FT3 which furnishes the desired frequency are each connected to the setting input S of a flip-flop F1, F2, F3, respectively, the non-inverted output Q of which each forms one of the outputs I, II, III, respectively.

The divider outputs of the first two dividers FT1 and FT2 are each connected to one input of a NAND gate N1, N2, respectively, the output of which is connected to the reset input R of the respective divider stage. The third divider FT3, on the other hand, has no NAND gate. The divider FT1 jointly with the flip-flop F1 and the NAND gate N1 forms a 1:30 divider stage. The divider FT2, the NAND gate N2 and the flip-flop F2 together form a 1:24 divider stage, and the divider FT3 with the flip-flop F3 forms a 1:20 divider stage.

The flip-flops F1, F2, F3 provided in the circuit and the flip-flops yet to be described are preferably constructed as D-flip-flops, the inverting outputs $\overline{Q}$ of which are fed back to the data input of the respective flip-flop.

The circuit point d was introduced in connection with the transistor 48 of the oscillator O in FIG. 3. The collector of this npn-transistor 48 is wired to the input of an AND gate U13 through another inverter I2. The other input of this AND gate U13 is controlled by the inverting output $\overline{Q}$ of the flip-flop F10 yet to be described. The output of the AND gate U13 is fed to the setting inputs S of the flip-flops F4, F5, F6, F7 and to the reset inputs of the flip-flops F8, F9, F10, F11 and F12. The output of the AND gate U13 is also connected to one output of each of a fourth 1:16 frequency divider FT4 and a fifth 1:16 frequency divider FT5. Finally, in a manner which is evident from FIG. 4, the AND gate U13 controls a NAND gate N5 which is cross-coupled to a second NAND gate N4, forming an RS-flip-flop N4, N5. The free input of the second NAND gate N4 of the flip-flop stage N4, N5 is controlled by a second output of the fourth frequency divider FT4 through an inverter I3.

The signal outputs of the two cross-coupled NAND gates N4 and N5, forming the Q and $\overline{Q}$ outputs of the RS-flip-flop N4, N5, respectively, are wired to the circuit points a and b already mentioned in connection with FIG. 3. The output of the NAND gate N4 represents the inverting $\overline{Q}$ output of the RS-flip-flop and is connected to the base of the npn-transistor 59 of the differential amplifier V through the circuit point b. On the other hand, the output of the NAND gate N5 forms the non-inverting output, i.e. the Q output of the flip-flop, and is connected through the circuit point a to the base of the npn-transistor 5, and therefore is provided to the reset input of the flip-flop 4, 5 in the switching stage SCH.

The first tone signal output I of the frequency divider circuit is connected to the clock input of the fourth frequency divider FT4, the output of which is applied to the clock input of the fifth divider FT5. The output of the fifth divider FT5 is connected, through an inverter I4, to the clock input t of the fourth D-flip-flop F4 of the circuit.

The D-flip-flops F4 to F7 form a chain, the non-inverting output Q of the respective preceding stage being connected to the clock input t of the respective succeeding stage. As already described, the setting inputs S of these D-flip-flops F4 to F7 are connected in parallel to each other and connected to the reset inputs R of the D-flip-flop cells F8 to F12. The Q output of the last flip-flop having its setting input S connected to the output of the AND gate U13, i.e. the flip-flop F7, is connected to the clock input t of the D-flip-flop F9 and to an input of an AND gate U4 belonging to the modulator Mo. The $\overline{Q}$ output of the D-flip-flop F7 is connected, on one hand, to the clock input (i.e. the t input) of the D-flip-flop F8 and, on the other hand, to an input of an AND gate U12 belonging to the modulator Mo. The Q output of the D-flip-flop F8 controls one input of each of four AND gates U9, U10, U11 and U12 of the modulator Mo. The $\overline{Q}$ output of the flip-flop F8 is connected to the clock input t of the flip-flop F10 having a $\overline{Q}$ output that is connected, as already described, to one input of the AND gate U13, while the non-inverting output of the flip-flop F10 is not used. The same applies to the Q output of the flip-flop F9, whereas its inverting output $\overline{Q}$ is provided for the control of one input of each of the four AND gates U1, U2, U3 and U4 in the modulator Mo. The clock input t of the flip-flop F11, the R input of which is driven by the AND gate gate U13, is connected to the $\overline{Q}$ output, i.e. the inverting output, of the flip-flop F6, which in turn is wired to an input of the AND gate U7 in the modulator Mo. The non-inverting Q output of the flip-flop F6, on the other hand, serves for the control of one input of each of the AND gates U3 and U11 of the modulator.

Furthermore, the non-inverting output Q of the first link F4 of the flip-flop chain, i.e. of the D-flip-flop F4, is connected to one input of each of the AND gates U1, U5 and U9 of the modulator. The Q output of the succeeding flip-flop F5 is connected to one input of each of the AND gates U2, U6 and U10 of the modulator, while the wiring arrangement from the outputs of the third D-flip-flop stage F6 of the chain to the AND gates of the modulator Mo has already been described, as has that of the stages F8 and F9, As already mentioned, the Q output of the flip-flop F7 is connected to one input of the AND gate U4. The Q output of the D-flip-flop F11 is clocked by the $\overline{Q}$ output of the flip-flop F6, is connected to the clock input of the D-flip-flop F12, and in addition is connected to one input of the AND gate U8 of the modulator Mo. The Q output of the D-flip-flop F12 is wired to one input of each of the AND gates U6, U7, U8 and U5 of the modulator.

Regarding the modulator, it is noted that in the case of the illustrated embodiment example, it includes twelve AND gates U1 to U12, each having three inputs. Each input of each gate is controlled, in the manner already described and evident from FIG. 4, either by one of the D-flip-flops F4 to F12 or by one of the tone signal outputs I, II, or III of the frequency divider circuit. It should be mentioned here that one input of each of the AND gates U1, U2, U3, U4 is acted upon the output III furnishing the 660 Hz frequency, one input of each of the AND gates U5, U6, U7 and U8 is acted upon by the output II furnishing the 550 Hz frequency, and one input of each of the AND gates U9, U10, U11 and U12 of the modulator Mo is acted upon exclusively by the output I of the tone frequency divider TT furnishing the 440 Hz frequency. However, the wiring arrangement described herein should be regarded as an example only. Another wiring arrangement, such as of the tone frequency outputs I, II and III to the modulator, would merely result in the tones of the tone sequence being produced so as to sound off in a different order.

The output of each of the AND gates U1 to U12 forming the modulator Mo is applied, through a resistor $R_1$* to $R_{12}$*, respectively, to the circuit point e which, as already mentioned, is connected to the input of the differential amplifier V. Accordingly, the circuit point e forms the summation point, i.e. the mixer M. The digital-to-analog converters DA1, DA2, DA3 are formed by the resistor groups $R_1$* to $R_4$*, $R_5$* to $R_8$* and $R_9$* to $R_{12}$*, respectively. The resistors $R_1$* to $R_{12}$* are staggered and have the following values, for example:

$$R_1^*=R_5^*=R_9^*=80 \text{ Kohm}, R_2^*=R_6^*=R_{10}^*=40 \text{ Kohm},$$

$$R_3^*=R_7^*=R_{11}^*=20 \text{ Kohm}, R_4^*=R_8^*=R_{12}^*=10 \text{ Kohm}.$$

This weighting of the resistors $R_1$* to $R_{12}$* causes the D-A (digital to analog) conversion.

In summary, therefore, the following can be stated: From a master oscillator O, oscillating at a base frequency of 13.2 kHz, the three frequencies 660 Hz, 550 Hz and 440 Hz are derived by division. One of the three frequencies is divided further, thereby obtaining the time base for the decay. One four-bit D-A converter per tone generates the decay voltage therefrom with which the three tones are successively generated and then faded again, overlapping each other. The fundamental base frequency is determined by an extraneous RC member. The starting voltage 5t is of rectangular wave shape. The harmonics content can be lessened by wiring a capacitor to the terminal 7*. Volume control is possible here too, by means of a potentiometer.

The circuit absorbs power only in its active state and disconnects automatically after the decay of the tone sequence. The circuit is triggered by the brief application of a voltage to the input 1*. If the trigger voltage is still or again present after the conclusion of the tone sequence, the tone sequence will repeat. Triggering the tone sequence is prevented if the trigger voltage is applied to the input 1* for a shorter period of time than the dead time.

The external wiring of the circuit according to the invention described so far, and preferably to be combined monolithically in a silicon chip, is performed in the simplest case as is shown in FIG. 1. The chip To containing the circuit is provided with the external terminal pins 1* to 7* already defined above. The supply voltage is furnished by a d-c voltage source UB, the pole of which furnishing the first "+" operating potential is connected to the terminal 1* through the activating switch Dt, and the pole furnishing the "−" reference potential is connected to the terminal 4* of the circuit To according to the invention. The terminal 3* is wired to the loudspeaker L through a capacitor C5, and the other terminal of the loudspeaker L is likewise connected to the reference potential. The terminal 2* is connected to the reference potential through a capacitor C6 and also directly to the "+" terminal of the supply voltage UB furnishing the operating potential, as shown in FIG. 1. Through the series connection of the resistor R1 and the capacitor C1, the terminal 6* is connected to the reference potential and also to the terminal 5* through the resistor R1 of the timing member alone. To improve the tone quality it is preferred to connect the terminal 7* to the reference potential through a capacitor C2.

Figure 5:
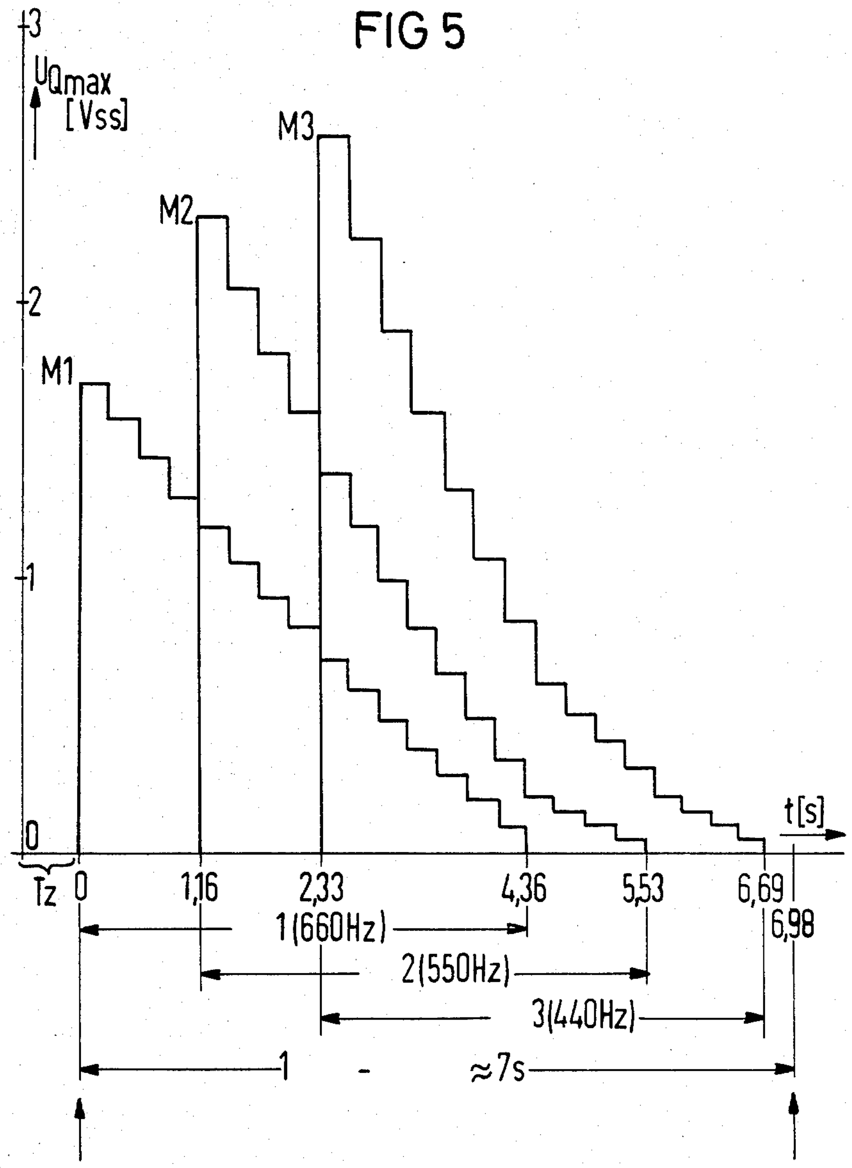
FIG. 5 is a graphical representation of the time behavior of the tone signals.

The embodiment of the tone generator circuit To as depicted in FIGS. 3, 4 and 5, leads to a time cycle for the tone sequence which is evident from the amplitude/time diagram according to FIG. 5. After the lapse of the dead time Tz the first tone, having a frequency of, for example, 660 Hz (according to the division ratios given in the description of FIG. 4 and the frequency of the master oscillator O), is transmitted to the loudspeaker. After 1.16 sec., i.e. already in the first decay phase, the second tone, having a frequency of, for example, 550 Hz, is transmitted to the loudspeaker L. After 2.33 sec., the third tone arrives at a frequency of 440 Hz, for example. The first tone has faded after 4.36 sec., the second tone after 5.53 sec., and the third tone after 6.69 sec. The tone sequence is repeated after 6.98 sec., if the start signal St is still applied to the inputs 1* and 2*. It is possible for the frequencies and cycle times to be determined by the circuit construction. However, no difficulties are encountered in working with other tone sequences and other tone frequencies.

The diagram according to FIG. 5 shows an example of the time behavior of the signals given to the loudspeaker L, in which M1, M2 and M3 are the maximum amplitudes of tone 1 (=660 Hz), tone 2 (=550 Hz) and tone 3 (=440 Hz). The superposition of the simultaneously-appearing amplitude values indicate the enveloping curve, and hence the course of the tone image in time. The tone sequence decays in 6.69 sec. after tone 1 of the tone sequence sets in. A repetition is possible 6.98 sec. after the tone sequence was first triggered. The ratio of the maximum amplitudes M3:M2:M1 is 1:0.89:0.67. The time scale for the oscillator frequency is 13.2 kHz.

We claim:

1. Digital tone generator comprising:

an oscillator generating a base frequency, a frequency divider driven by said base frequency and generating a plurality of tone frequencies, said tone frequencies being sub-multiples of said base frequency, a starting circuit operatively responsive to a start switch, said starting circuit operating to activate said oscillator and to activate a stable voltage supply, a modulator comprising a plurality of modulator modules, said plurality equal to and corresponding to said plurality of tone frequencies, a general cycle control operatively responsive to said frequency divider to generate tone modulation control cycles, a plurality of DA-converters, said plurality equal to and corresponding to said plurality of modulator modules, said frequency divider and said general cycle control jointly controlling said modulator to produce a plurality of modulated tone frequencies, said plurality equal to and corresponding to said plurality of modulator modules, said plurality of DA-converters operatively responsive to said modulated tone frequencies to produce modulated analog tone frequencies, and a mixer for receiving said modulated analog tone frequencies to produce a sequence of modulated analog tones.

2. Digital tone generator according to claim 1 wherein said starting circuit further comprises:

an electro-acoustic transducer, a bistable switch having a set and a reset state and start input connections, said switch responsive to a start signal at one of said input connections to activate said stable voltage supply, said stable voltage supply generating a stable voltage, said stable voltage operating to energize all circuits constituting said tone generator.

3. Tone generator according to claim 2 further comprising an amplifier having a control input connected between the outputs of said DA-converter outputs and an electro-acoustic transducer which is responsively connected to the amplifier.

4. Tone generator according to claim 3, wherein said cycle control further comprises means for interrogating the state present at said input connections of said bistable switch after the lapse of a given dead time and after a response to the start signal of said bistable switch, for releasing the generation of the tone sequence exclusively in the presence of the start signal at said input connections of said bistable switch.

5. Tone generator according to claim 4, further comprising means responsive to said general cycle control for again interrogating for the presence of the start signal at said input of said bistable switch at the end of said sequence of analog tones.

6. Tone generator according to claim 3, wherein said oscillator further comprises means for generating a reset pulse for resetting said cycle control to a starting state required for generation of the tone sequence, after activation by said stable voltage.

7. Tone generator according to claim 6, wherein said bistable switch and stable voltage supply further comprises a first npn-transistor having a base connected to said input connections activatable by the start signal, an emitter connected to reference potential, and a collector, a circuit input carrying a first operating potential, a voltage divider connected between said first operating potential input and the collector of said first npn-transistor, a pnp-transistor having a base connected to the divider point of said voltage divider, an emitter connected to said first operating potential input, and a collector, a first resistor connected between said collector of said pnp-transistor and reference potential, a second resistor connected to said collector of said pnp-transistor, a second npn-transistor having a base connected to the collector of said pnp-transistor through said second resistor, an emitter of said second npn transistor furnishing said voltage furnished by said stable voltage supply, and a collector, a third npn-transistor having a base connected directly to the emitter of said second npn-transistor and a collector, a third resistor connected between the emitter and the base of said second npn-transistor, the collectors of said second and third npn-transistors being connected directly to said first operating potential input and to the emitter of said pnp-transistor, a diode combination effecting voltage stabilization being connected between the base of said second npn-transistor and reference potential, and a resistor and diode combination being connected between reference potential and the base of said first npn-transistor connected to said input connections.

8. Tone generator according to claim 7, further comprising a fourth npn-transistor having an emitter and a collector directly connected to the emitter and the collector of said first npn-transistor, respectively, and a base, a fourth resistor connected between the base of said fourth npn-transistor and the collector of said pnp-transistor of said bistable switch, a fifth resistor connected between reference potential and the base of said fourth npn-transistor, and an RS-flip-flop being controlled by said frequency divider and having a non-inverting output connected to said base of said fourth npn-transistor.

9. Tone generator according to claim 8, wherein said amplifier further comprises an output and a fifth npn-transistor having a collector-emitter path connected between the emitter of said third npn-transistor and the output of said amplifier.

10. Tone generator according to claim 9, wherein said oscillator further comprises a signal output for controlling said frequency divider furnishing oscillations required for the tone sequence, and including another divider stage forming said cycle control and being clocked by the one of the outputs of said frequency divider furnishing the highest frequency, said tone signal outputs of said frequency divider and said divider stage together controlling said modulator.

11. Tone generator according to claim 3, wherein said bistable switch is a flip-flop being controlled by said start signal acted upon by the start signal and having a signal output for driving said stable voltage supply.

12. Tone generator according to claim 3, wherein said amplifier further comprises an input, said cycle control includes outputs, and said modulator includes a plurality of identical logic gates operating independently of each other and being controlled individually by the outputs of said frequency divider and the outputs of said cycle control, said gates having outputs connected to said input of said amplifier for the joint logic control of said amplifier.

13. Tone generator according to claim 12, wherein said logic gates are AND gates each having three signal inputs, and wherein one of said inputs of each AND gate is connected to an output of said frequency divider and wherein said other two of said inputs of each AND gate each connected to one output of said cycle control.

14. Tone generator according to claim 12 13, further comprising a plurality of resistors each being connected between the input of said amplifier and the output of one of said logic gates of said modulator for application of said analog tones to the input of said amplifier, said resistors having values being balanced in accordance with said logic gates wired thereto for delivering an analog signal to said amplifier corresponding to the number of logic gates of a tone signal output of said frequency divider and simultaneously activated by said cycle control.

15. Tone generator according to claim 3, further comprising a circuit input carrying a first operating potential, a reference potential input, a terminal receiving a stabilized operating potential through said stable voltage supply, a control input of said oscillator for frequency control of said oscillator, a manually operable switch connected between said input connections for receiving said start signal of said bistable switch and said first operating potential input, a capacitor, an output of said amplifier, said electro-acoustic transducer being connected through said capacitor to said ouput of said amplifier and being directly connected to said reference potential input, and a resistor and another capacitor together determining the frequency of said oscillator, said stabilized operating potential terminal being connected through said resistor and said other capacitor to said reference potential input and through said resistor to said control input of said oscillator.

16. Tone generator according to claim 15, further comprising an input for said amplifier, and a further capacitor connected between said input for said amplifier and said reference potential input.

17. Tone generator according to claim 3, wherein said amplifier further comprises an additional control input, said additional control input operatively responsive to other circuits.

* * * * *